(12) United States Patent
Liu

(10) Patent No.: US 6,442,031 B1
(45) Date of Patent: Aug. 27, 2002

(54) RETAINING STRUCTURE FOR INDUSTRIAL CONSOLE

(76) Inventor: Cheng Kuo Liu, 3F, No. 143, Sec. 3, Huan Ho S. Rd., Wan Hua Dist., Taipei (TW)

( * ) Notice: Subject to any disclaimer, the term of this patent is extended or adjusted under 35 U.S.C. 154(b) by 0 days.

(21) Appl. No.: 09/899,179

(22) Filed: Jul. 6, 2001

(51) Int. Cl.[7] ................................................. H05K 5/00
(52) U.S. Cl. ..................... 361/727; 312/334.1; 361/730; 439/65
(58) Field of Search .................. 211/194, 195, 211/201, 41.17; 439/64, 65; 361/600, 724–729, 727, 730, 732, 733, 825, 827, 829; 312/223.1, 223.2, 332.1, 334.1; 248/65, 73

(56) References Cited

U.S. PATENT DOCUMENTS

| | | | | |
|---|---|---|---|---|
| 3,569,788 A | * | 3/1971 | Niblack | 361/727 |
| 3,710,199 A | * | 1/1973 | Cignoni, Jr. | 361/827 |
| 5,657,204 A | * | 8/1997 | Hunt | 361/752 |
| 6,025,989 A | * | 2/2000 | Ayd et al. | 361/695 |
| 6,305,764 B1 | * | 10/2001 | Kortman et al. | 312/3 |
| 6,373,695 B1 | * | 4/2002 | Cheng | 361/685 |
| 6,377,449 B1 | * | 4/2002 | Liao et al. | 361/685 |

* cited by examiner

*Primary Examiner*—Gerald Tolin
(74) *Attorney, Agent, or Firm*—Rabin & Berdo, P.C.

(57) ABSTRACT

A retaining structure for industrial console comprises at least two sliding rails and two sliding plates slidably arranged on both sides of two brackets such that the brackets can be adapted to fit industrial rack of various sizes. The two brackets are further assembled with a supporting horizontal bar and two sliding grooves such that an operative module and an optional function module can be detachably arranged on both sides of the brackets. The assembling and detaching of the inventive retaining structure is very easy and flexible.

10 Claims, 10 Drawing Sheets

RETAINING STRUCTURE FOR INDUSTRIAL CONSOLE

FIELD OF THE INVENTION

The present invention relates to a retaining structure for industrial console, especially to a retaining structure for industrial console to fit industrial rack of various lengths.

BACKGROUND OF THE INVENTION

As shown in FIG. 1, the prior art industrial console comprises a frame 10 on an industrial rack (not shown), an operative module 11 and an optional function module 12, wherein the operative module 11 has a plurality of operative buttons and displays (not shown) thereon and the optional function module 12 has a plurality of interfaces (not shown) for user. The operative module 11 and the optional function module 12 are connected by a cable 13 to provide data transmission therein.

The operative module 11 and the optional function module 12 are fixed within the frame 10. The frame 10, the operative module 11 and the optional function module 12 are locked to the industrial rack. The relevant interfaces of the optional function module 12 are connected to the operative buttons and displays of the operative module 11 through the cable 13 to facilitate operation for user.

However, in above-mentioned industrial console, the operative module 11 is not fixedly arranged on the frame 10 and the operative module 11 is liable to slide out from built-in rail within front portion of the frame.

Moreover, the operative module 11 and the optional function module 12 are not separable. In other word, each optional function module 12 is assembled with an operative module 11. The operative module 11 is generally provided with expensive LCD panel. Therefore, operative modules 11 with numbers equal to that of the optional function module 12 are required to assemble integral industrial console even though only part of the interfaces of the optional function module 12 are used. The provision of the operative modules 11 wastes considerable cost.

SUMMARY OF THE INVENTION

It is the object of the present invention to provide a retaining structure for industrial console to fit industrial rack of various lengths.

In one aspect of the present invention, the retaining structure for industrial console has a supporting horizontal bar with tongue fit with a clamping part of an operative module, whereby the operative module can be firmly retained.

In another aspect of the present invention, the retaining structure for industrial console has two sliding rails and two sliding plates slidably arranged on both sides of two brackets such that the brackets can be adapted to fit industrial rack of various sizes.

In still another aspect of the present invention, the retaining structure for industrial console has detachable operative module such that the LCD panel and operative buttons on the operative module can be flexibly used.

To achieve above object, the present invention provides a retaining structure for industrial console having at least two sliding rails and two sliding plates slidably arranged on both sides of two brackets such that the brackets can be adapted to fit industrial rack of various sizes. The two brackets are further assembled with a supporting horizontal bar and two sliding grooves such that an operative module and an optional function module can be detachably arranged on both sides of the brackets. The assembling and detaching of the inventive retaining structure is very easy and flexible.

The various objects and advantages of the present invention will be more readily understood from the following detailed description when read in conjunction with the appended drawing, in which:

DETAILED DESCRIPTION OF THE INVENTION

Figure 1:
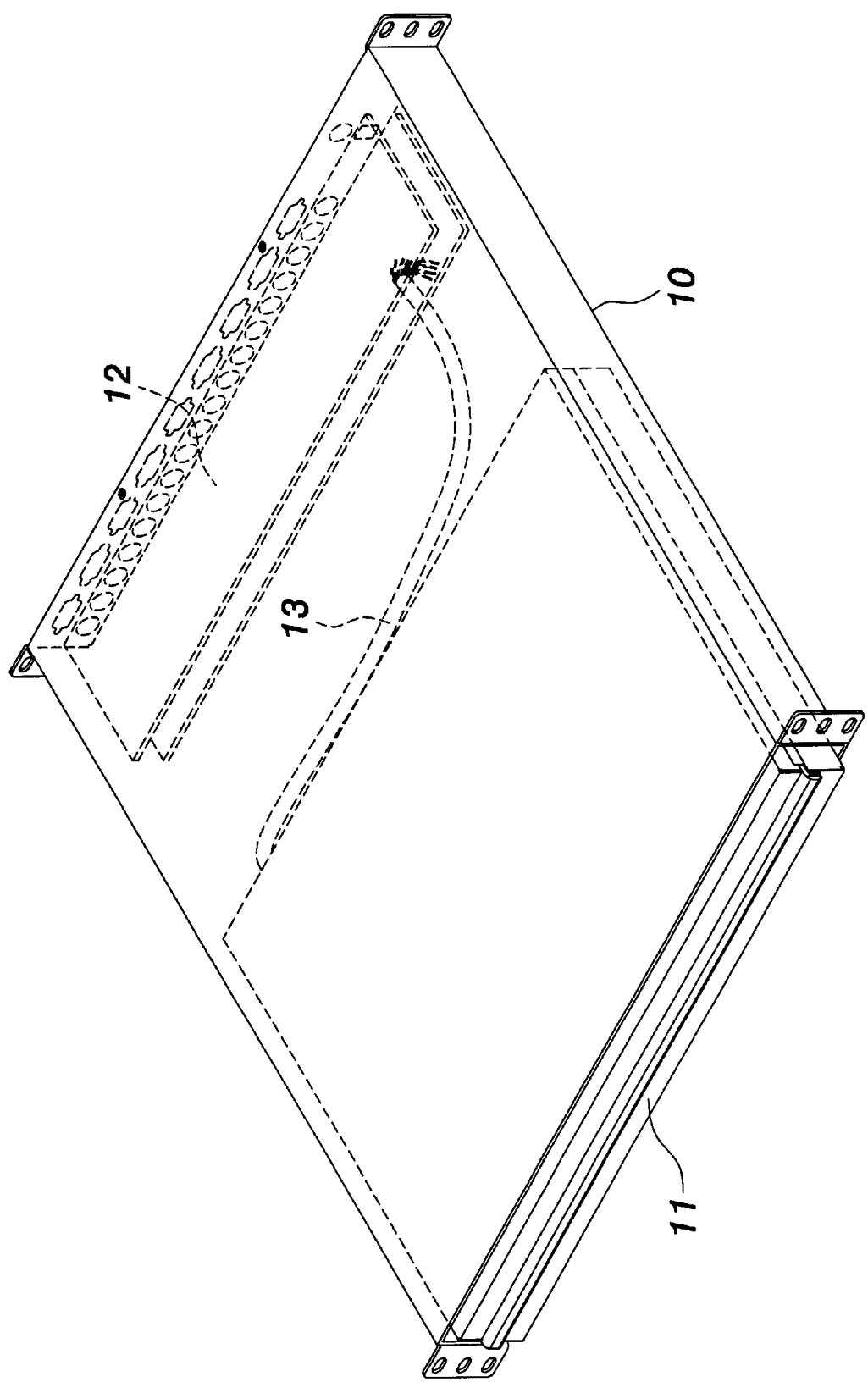
FIG. 1 shows the perspective view of prior art industrial console.

With reference now to FIGS. 2 to 10, the present invention is intended to provide a retaining device for industrial console for industrial rack of various sizes. The retaining device comprises two brackets 20, two sliding rails 22, two sliding plates 23, two sliding shafts 24, an operative module 30, a supporting horizontal bar 40, an optional function module 50, two sliding members 60 and two sliding grooves 70.

Figure 10:
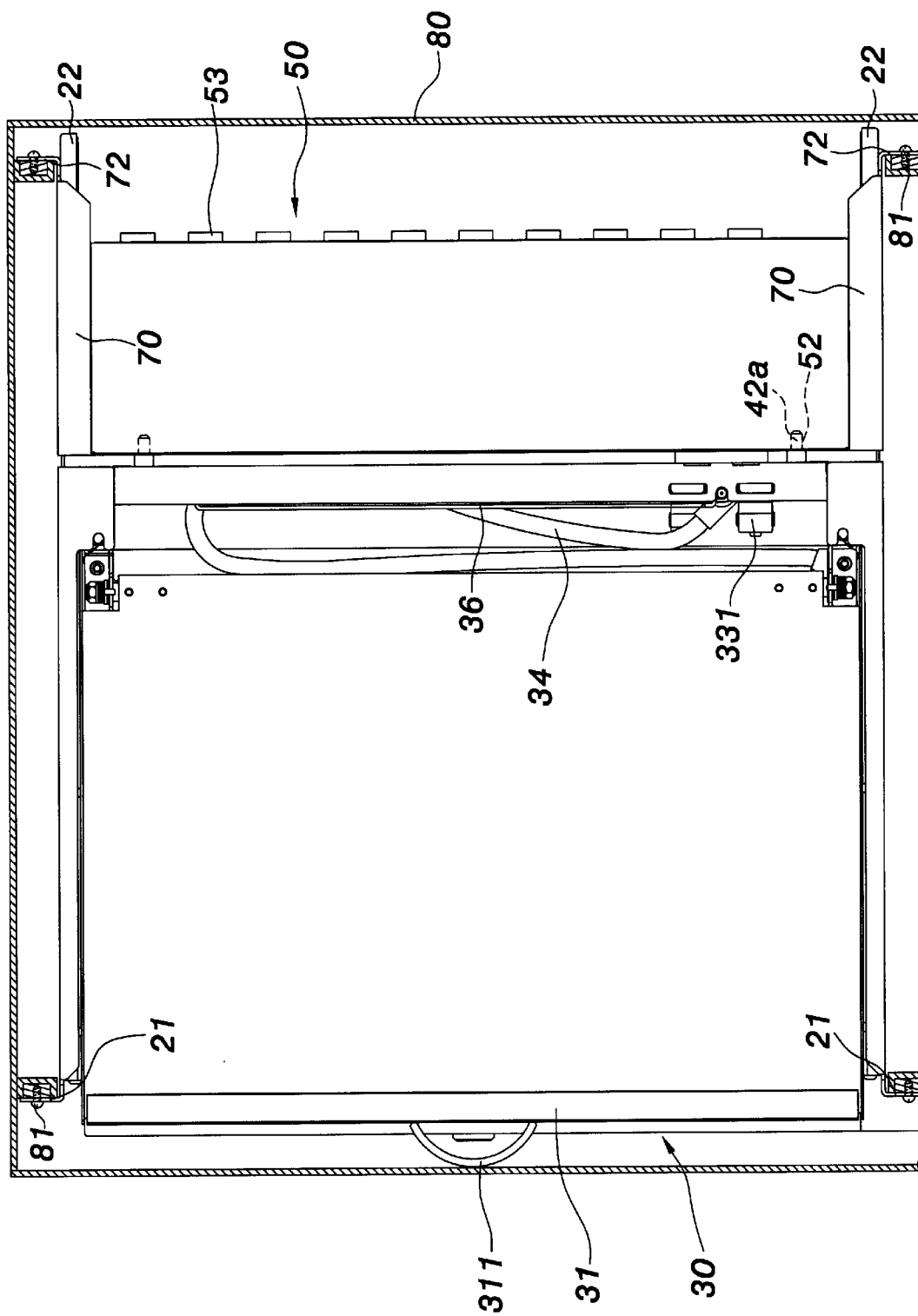
FIG. 10 is a sectional view showing the assembling of the present invention with an industrial rack.

The brackets 20 are integrally made of metal and arranged on an industrial rack 80 as shown in FIG. 10. Each bracket 20 has a lug 21 at front side thereof and each lug 21 has a plurality of fixing holes 211, whereby fixing members 81 such as screws, pins or rivets can screwed into the fixing holes 211 to fix the bracket 20 on the industrial rack 80 as shown in FIG. 10.

Figure 5:
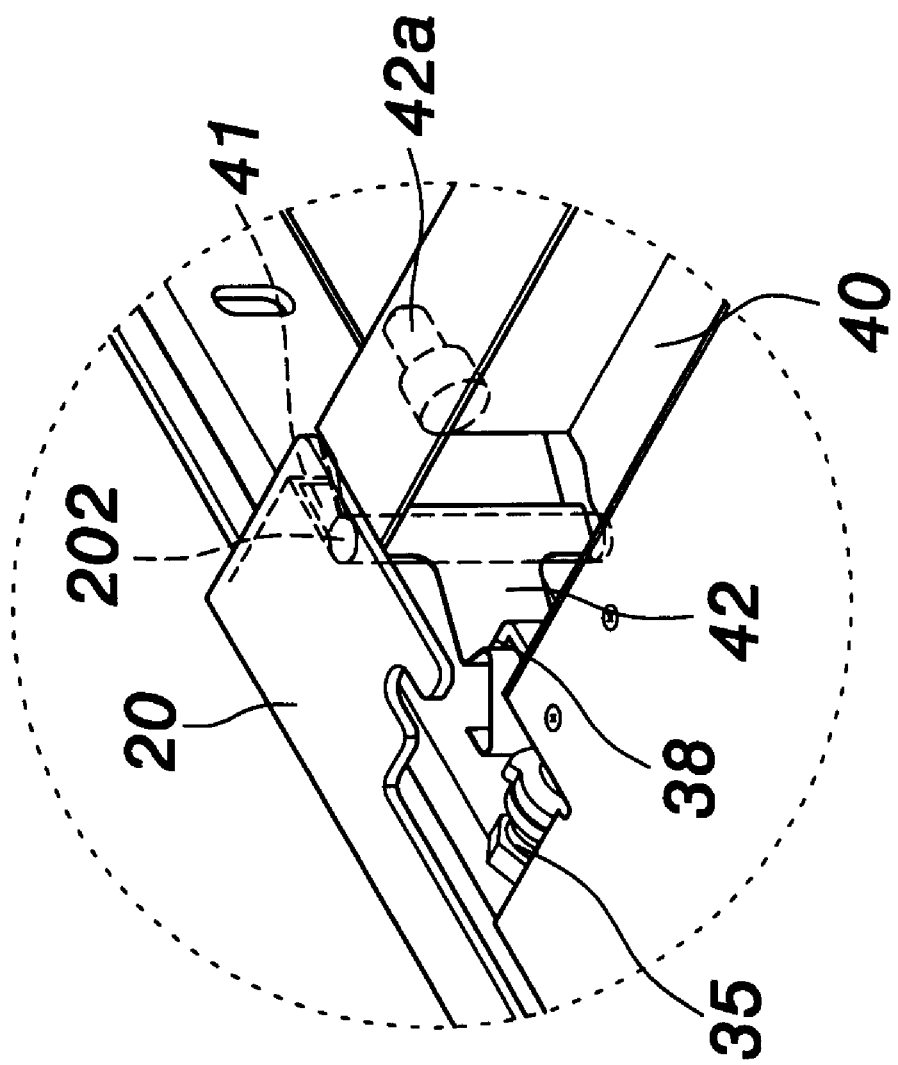
FIG. 5 shows an enlarged view of part A in FIG. 4.

The bracket 20 has a connection pin 202 at rear side thereof, which is fit into a recess 41 on the supporting horizontal bar 40 as shown in FIG. 5 to link the supporting horizontal bar 40 and the bracket 20. The operative module 30 and the optional function module 50 are arranged at front side and rear side of the supporting horizxontal bar 40, respectively, as shown in FIG. 3.

Figure 2:
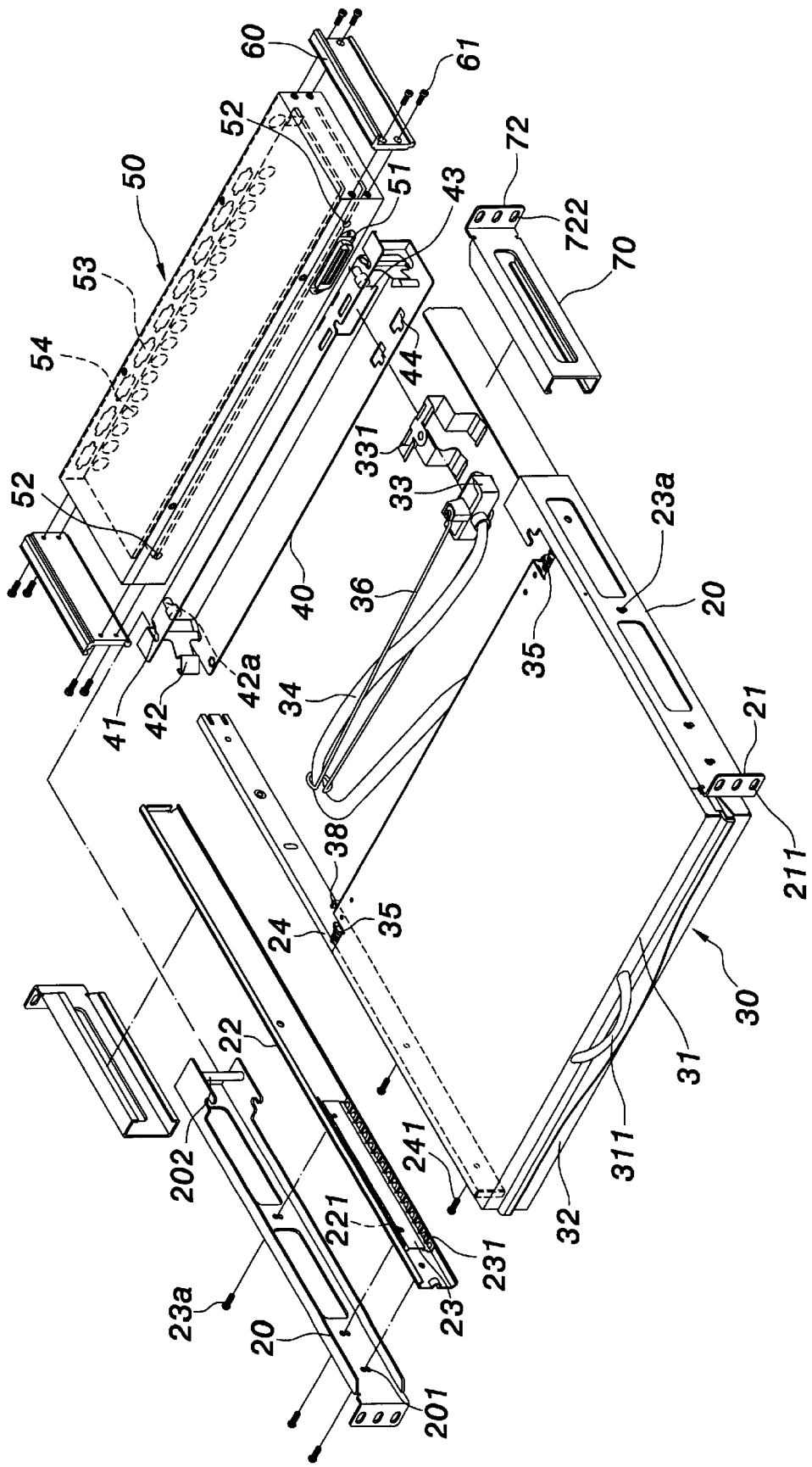
FIG. 2 shows the exploded view of the present invention.
Figure 3:
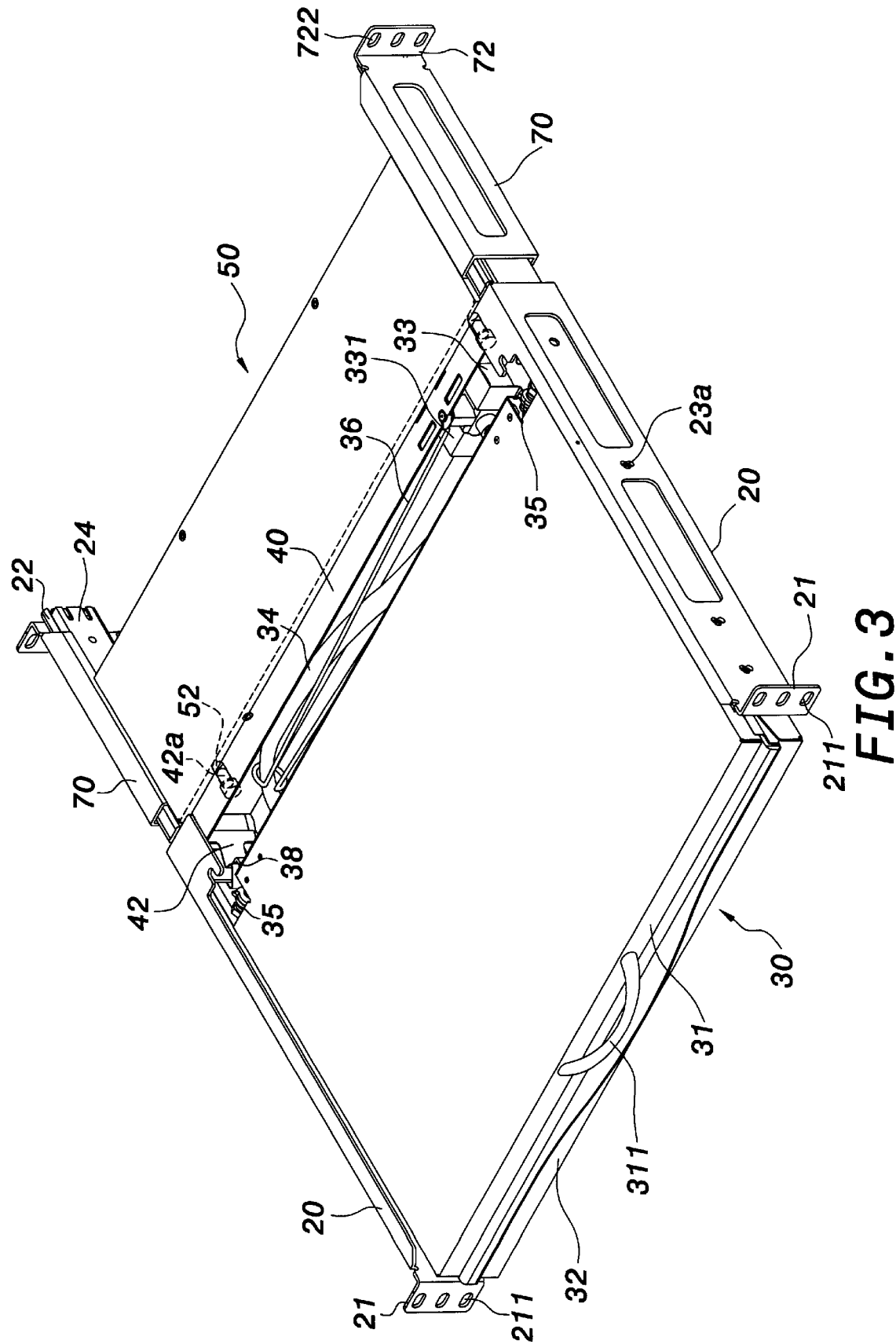
FIG. 3 shows the perspective view of the present invention.

The bracket 20 has a plurality of holes 201 and the sliding rails 22 have corresponding holes 221 such that the bracket 20 can be assembled with the sliding rails 22 by screwing the holes 201 and 221 with fixing members 23a such as screw, pin or rivets, as shown in FIGS. 2 and 3.

The sliding rail 22 has length corresponding to the industrial rack 80 with about 500–950 mm sizes. The sliding rail 22 has a sliding plate 23 with a plurality of rolling balls 231 to facilitate the sliding plate 23 rolling in the sliding rail 22. The sliding plate 23 is also fit to the sliding shaft 24 and the balls 231 also facilitate the sliding plate 23 rolling in the sliding shaft 24. The sliding shaft 24 is fixed to the operative module 30 by a plurality of screws 241.

The operative module 30 is composed of an upper cover 31 and a lower cover 32 pivotally connected through a pivotal part 35 and a clamping part 38. The upper cover 31 can be opened through the pivotal part 35. The operative module 30 contains a plurality of buttons (not shown) and LCD panels 37 (as shown in FIG. 7) therein and the upper cover 31 has an arc-shaped handle 311 on front side thereof to facilitate the user to open the upper cover 31.

Figure 7:
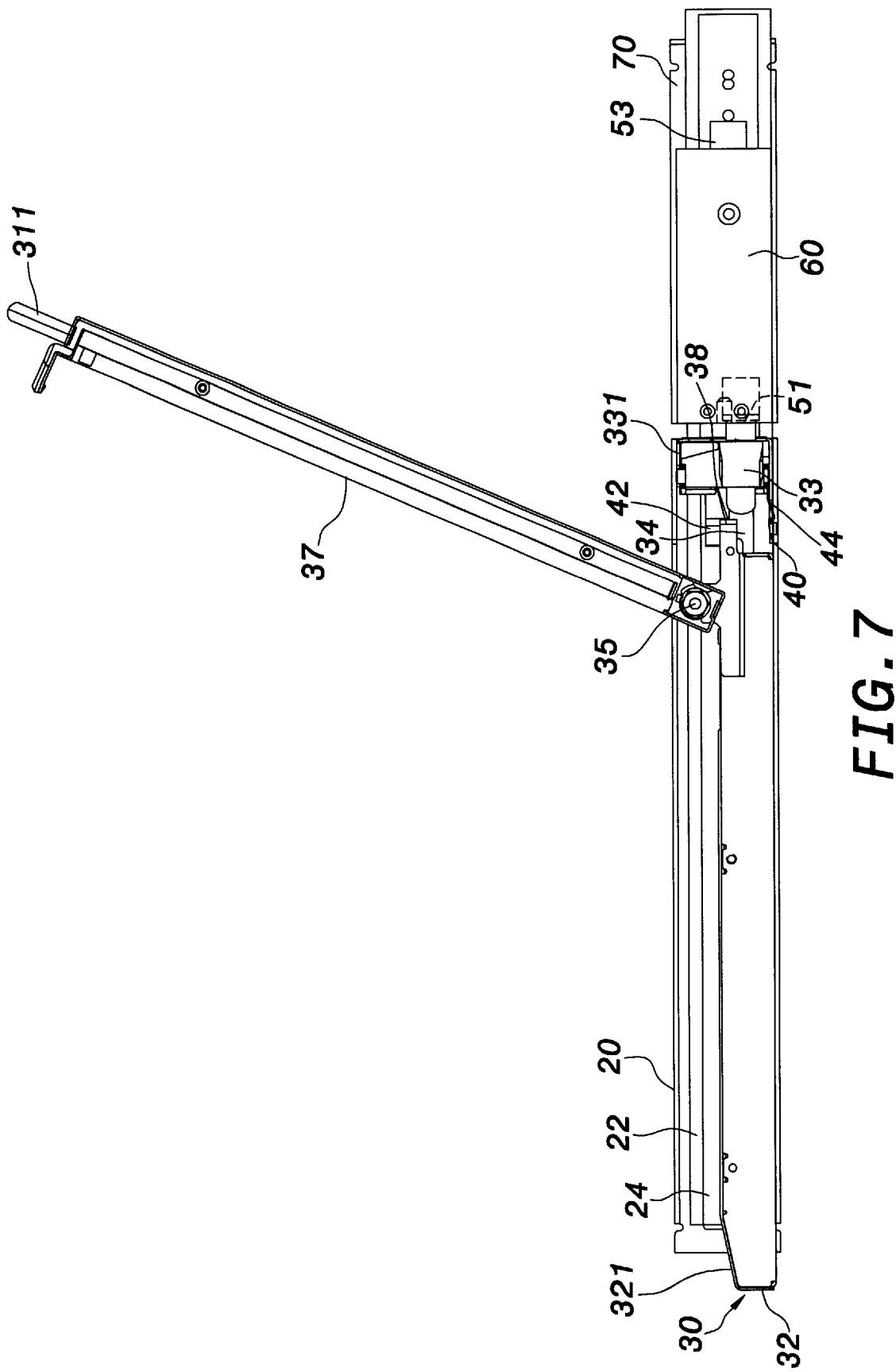
FIG. 7 shows the operation of the of the present invention.

The lower cover 32 has a bevel 321 to provide ergonomic effect for operating the buttons, as shown in FIG. 7.

Figure 6:
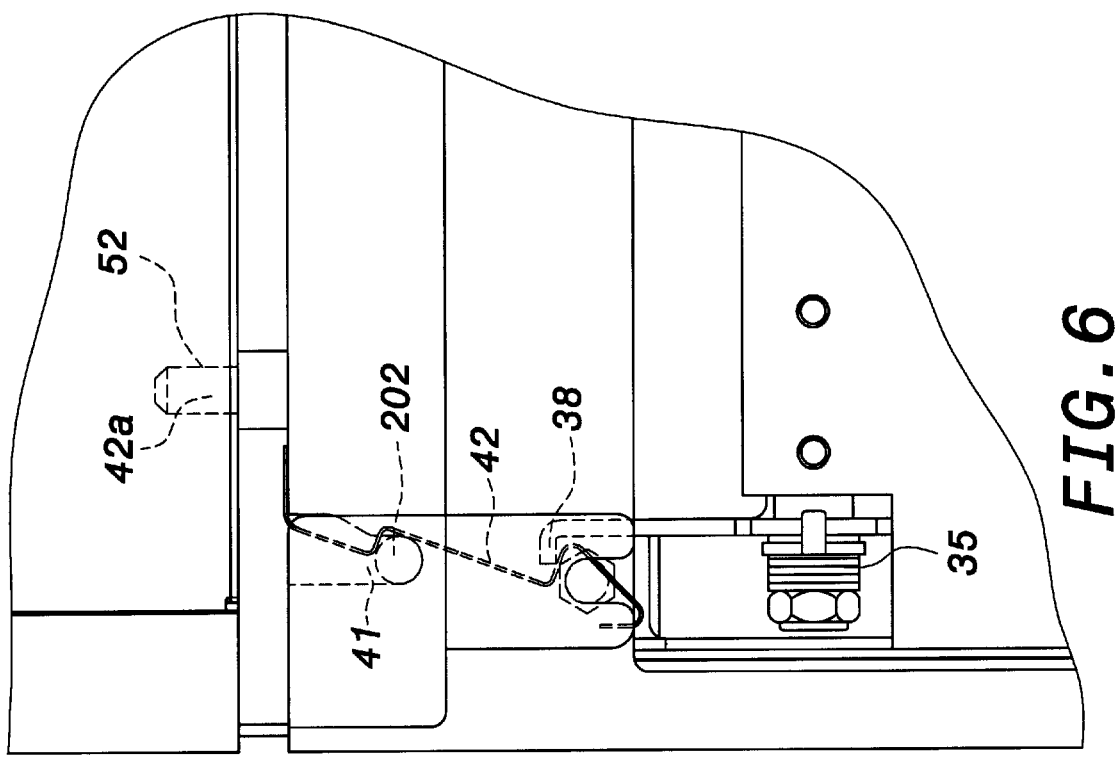
FIG. 6 shows partially sectional view of the present invention.

The clamping part 38 is fit to a tongue 42 on the supporting horizontal bar 40 as shown in FIG. 5 to link the supporting horizontal bar 40 with the operative module 30 as shown in FIG. 6. Therefore, the operative module 30 will not be slid out when not being used.

The sliding groove 70 has a second lug 72 with a plurality of holes 722 screwed by fixing members 81 to lock the sliding groove 70 on the industrial rack 80 as shown in FIG. 10.

Figure 4:
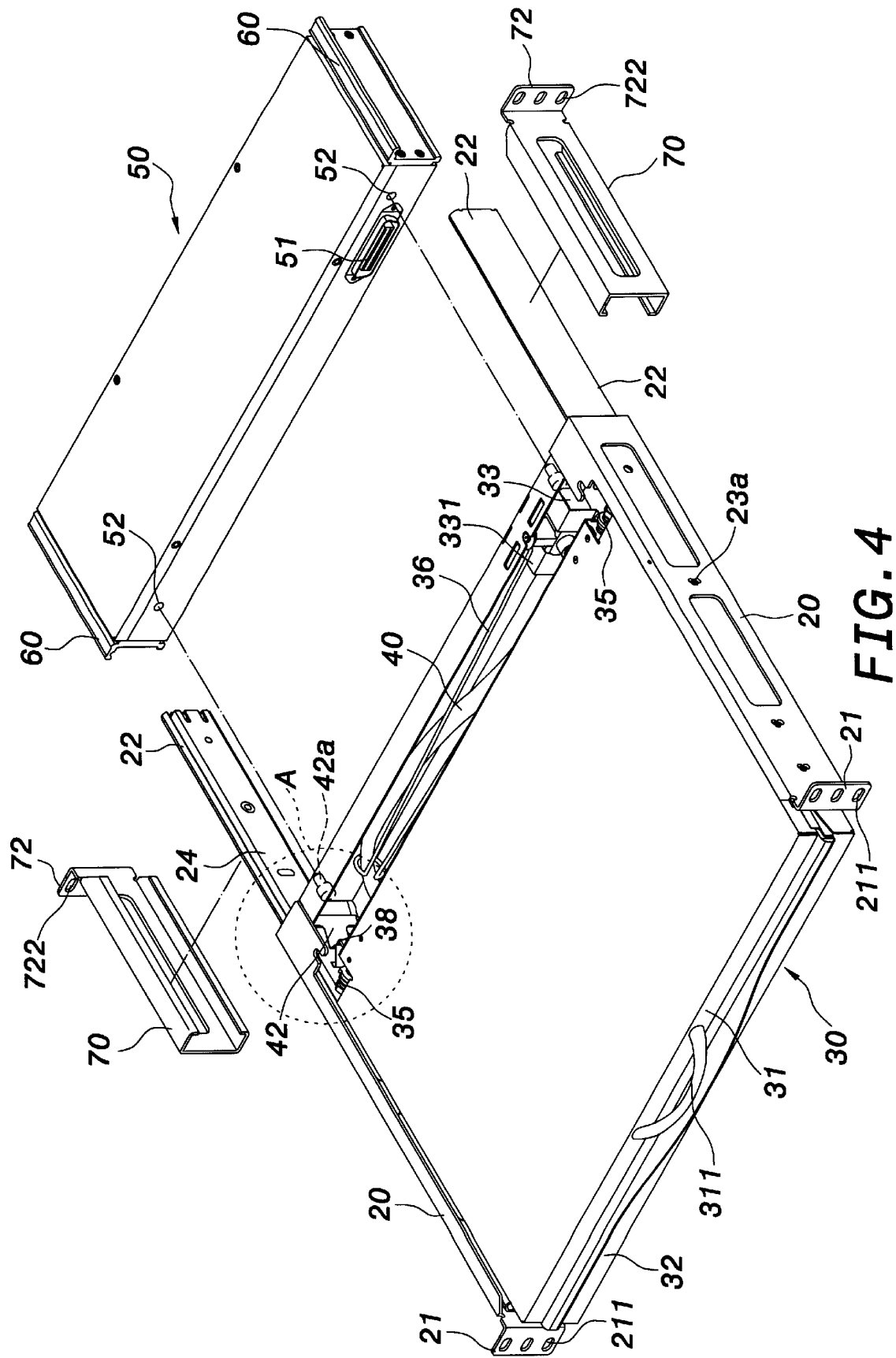
FIG. 4 shows the exploded view of the optional function module.

The sliding members 60 are slidably fit into the sliding grooves 70, as shown in FIGS. 3. The sliding members 60 can be slid out of the sliding grooves 70, as shown in FIGS. 4 to replace the optional function module 50 screwed to the sliding members 60.

As shown in FIGS. 2 and 3, the optional function module 50 is screwed to the sliding members 60 by a plurality of screws 61 such that the optional function module 50 is arranged on inner sides of the sliding grooves 70 in a detachable fashion.

The optional function module 50 has a plurality of interfaces (not shown) for user and a first connector 51 at front side thereof, as shown in FIG. 2. The first connector 51 has outer flange fit with an opening 43 on the supporting horizontal bar 40. The first connector 51 passes through the opening 43 and is connected to a third connector 33 on the operative module 30. The operative module 30 has a transmission cable 34 through which the signal from the optional function module 50 can be sent to the operative module 30. More particularly, the interfaces of the optional function module 50 communicate the buttons and display panel of the operative module 30 through the first connector 51, the transmission cable 34 and the third connector 33 to facilitate the data accessing of the optional function module 50.

Figure 8:
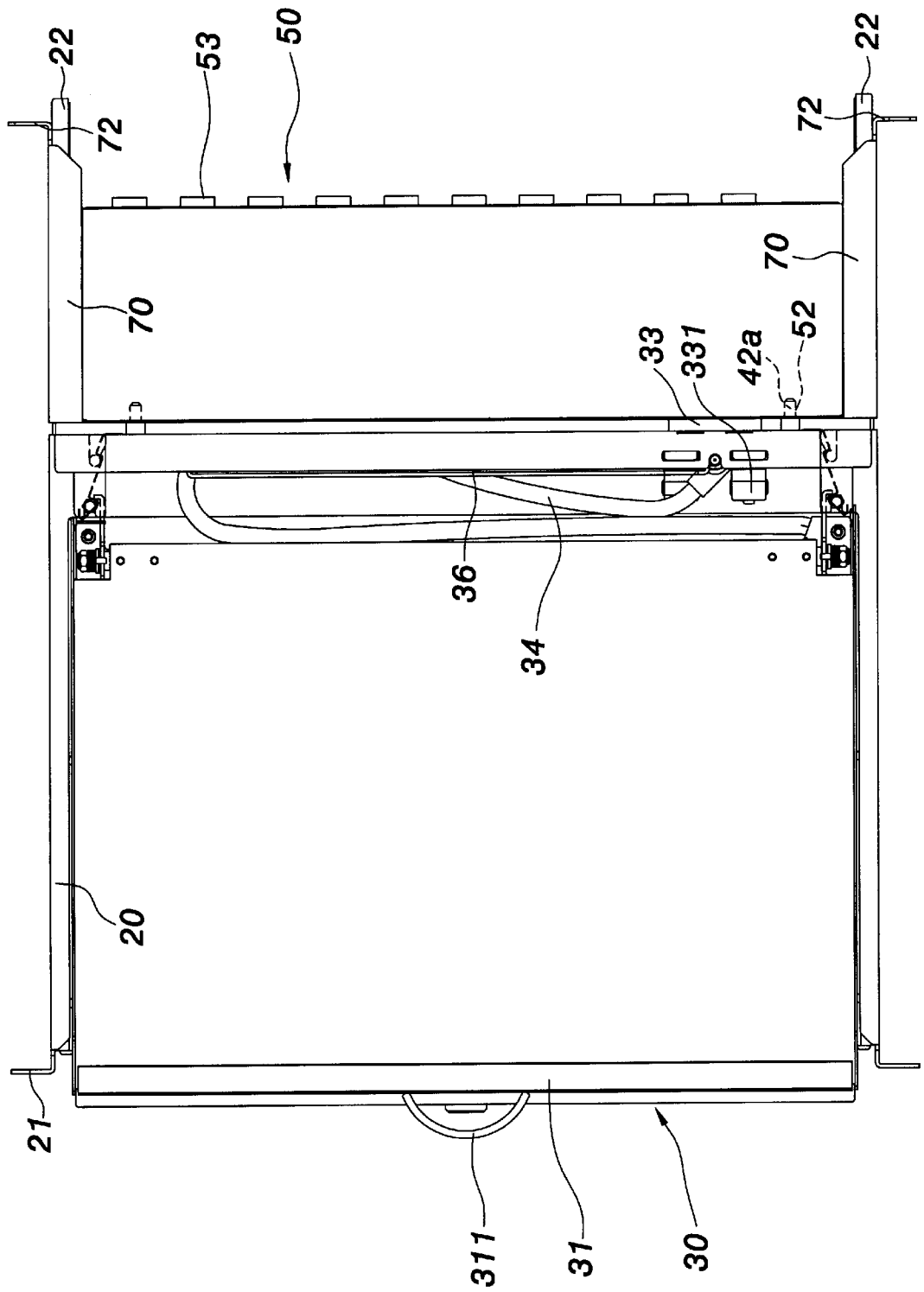
FIG. 8 shows the top view of the present invention.
Figure 9:
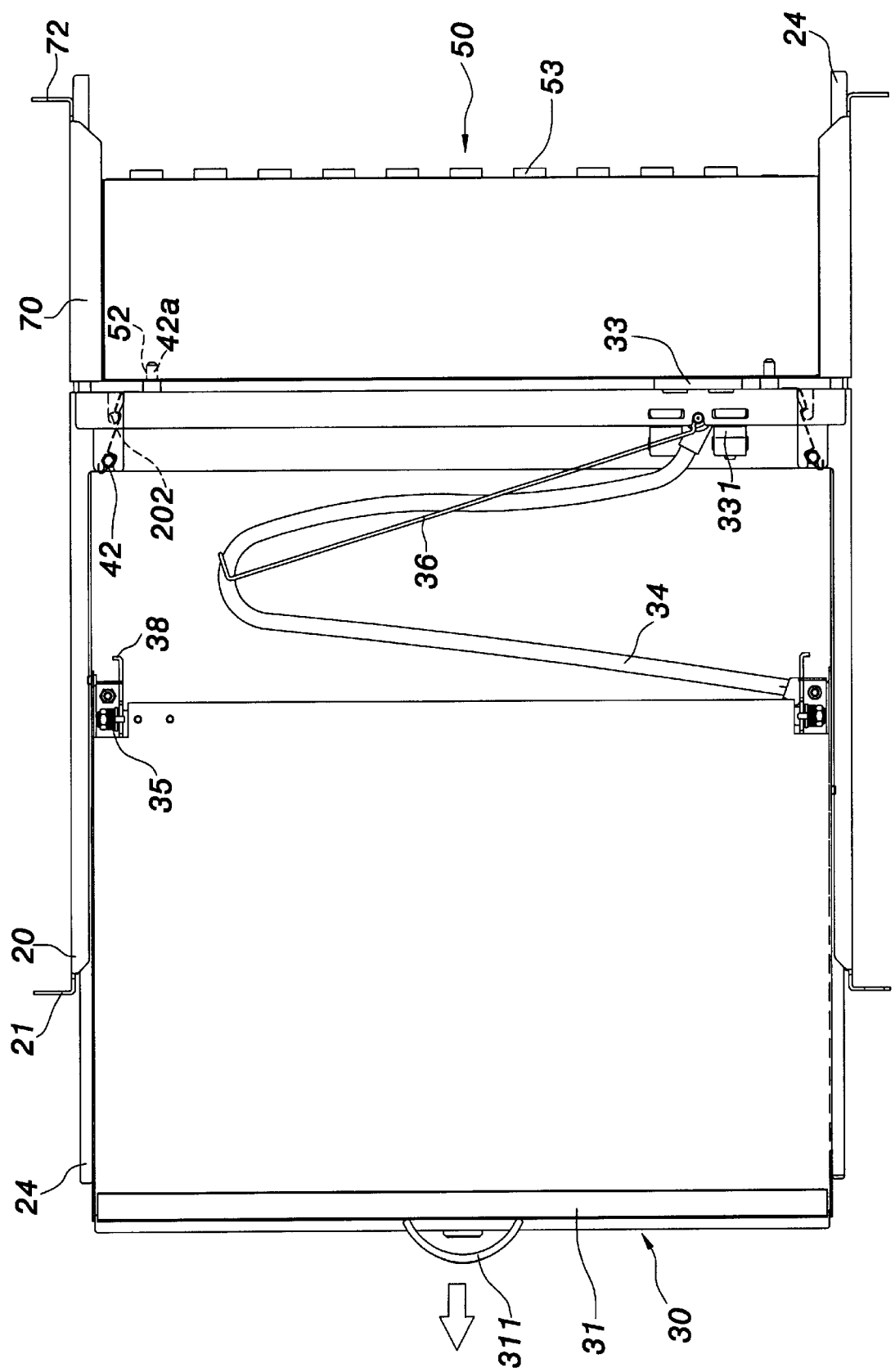
FIG. 9 is a top view showing the operation of the of the present invention.

The retaining structure further has a cable fixer 36 to fix the cable 34 such that the cable 34 is retained between the operative module 30 and the optional function module 50, as shown in FIG. 3. The cable fixer 36 has one end pivotally connected to the case of the third connector 33, as shown in FIG. 2. The third connector 33 has a locking member 331 fit with a locking groove 44 on the supporting horizontal bar 40 to enhance the assembling force for the cable fixer 36 and the third connector 33. The cable fixer 36 prevents the cable 34 from entanglement due to operation of the operative module 30 and the optional function module 50, as shown in FIGS. 8 and 9.

The optional function module 50 has a locking groove 52 on front side thereof and is fit to a corresponding locking bump 42a on the supporting horizontal bar 40, as shown in FIGS. 3 and 4. The locking groove 52 is locked with the locking bump 42a to enhance the assembling force between the supporting horizontal bar 40 and the optional function module 50 and prevent the detaching of the first connector 51 from the third connector 33. Therefore, the interfaces of the optional function module 50 have confidential connection with the operative module 30.

The optional function module 50 has a plurality of second connectors 53 and a plurality of connection ports 54 on rear side thereof to provide the optional function module 50 with external connection, expansion and update ability.

The length of the retaining structure including the sliding rails 22, the sliding shafts 24, the optional function module 50, and the two sliding members 60 can be increased or decreased with respect to the length of the operative module 30, the optional function module 40 and the industrial rack 80. Therefore, the retaining structure can be adapted to the LCD panel of different sized in the operative module 30. Alternatively, the length of the optional function module 50 can also be increased or decreased to modify the interfaces thereof and to fit the standard 500–950 mm industrial rack 80.

Moreover, in the present invention, the connection pin 202 of the bracket 20 is fit into the recess 41 on the supporting horizontal bar 40. The clamping part 38 of the operative module 30 is fit to the tongue 42 on the supporting horizontal bar 40. The locking groove 52 of the optional function module 50 is locked with the locking bump 42a of the supporting horizontal bar 40. The operative module 30 and the optional function module 50 are detachably fixed to the supporting horizontal bar 40 by a plurality of screws 241 and 61. The assembling and detaching of the inventive retaining structure is very easy and flexible.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A retaining structure for industrial console, comprising two brackets each having a connection pin at rear side thereof;
   a supporting horizontal bar having two recesses each being fit to the connection pin;
   an operative module arranged on one side of the bar;
   an optional function module detachably arranged on another side of the bar;
   a transmission cable having one end connected to the operative module and another end connected to the optional function module;
   two sliding grooves arranged on outer side of the two brackets; and
   two sliding members fixed on both sides of the optional function module and slidable within the two sliding grooves.

2. The retaining structure for industrial console as in claim 1, wherein each bracket has a lug on one side thereof to facilitate the bracket being fixed on an industrial rack.

3. The retaining structure for industrial console as in claim 1, wherein each bracket and each sliding groove has holes screwed to a sliding rail by a fixing member.

4. The retaining structure for industrial console as in claim 3, wherein each fixing member is screw, pin or rivet.

5. The retaining structure for industrial console as in claim 3, wherein each sliding rail has a variable length adapted to the industrial rack.

6. The retaining structure for industrial console as in claim 1, wherein the supporting horizontal bar has a tongue fit to a clamping part of the operative module.

7. The retaining structure for industrial console as in claim 1, wherein the operative module has an upper cover and a lower cover, the upper cover has an arc-shaped handle on front side thereof to facilitate a user to open the upper cover.

8. The retaining structure for industrial console as in claim 7, wherein the lower cover has a bevel to provide ergonomic effect.

9. The retaining structure for industrial console as in claim 1, further comprising a cable fixer to fix the cable such that the cable is retained between the operative module and the optional function module.

10. The retaining structure for industrial console as in claim 1, wherein the optional function module has a plurality of connectors and a plurality of connection ports to provide the optional function module with external connection, expansion and update ability.

* * * * *